(12) United States Patent
Takayanagi et al.

(10) Patent No.: US 8,779,836 B2
(45) Date of Patent: *Jul. 15, 2014

(54) POWER SWITCH ACCELERATION SCHEME FOR FAST WAKEUP

(71) Applicant: Apple Inc., Cupertino, CA (US)

(72) Inventors: Toshinari Takayanagi, San Jose, CA (US); Shingo Suzuki, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/972,577

(22) Filed: Aug. 21, 2013

(65) Prior Publication Data

US 2013/0335133 A1 Dec. 19, 2013

Related U.S. Application Data

(63) Continuation of application No. 13/285,269, filed on Oct. 31, 2011, now Pat. No. 8,542,054.

(51) Int. Cl.
*H03K 17/296* (2006.01)

(52) U.S. Cl.
USPC ........... 327/395; 327/392; 327/393; 327/400; 307/130

(58) Field of Classification Search
CPC ................................. H03K 5/133; H03K 5/15
USPC ......... 327/113, 295, 434, 392, 393, 395, 400, 327/403, 509; 307/126, 130; 326/93, 96
See application file for complete search history.

(56) References Cited

U.S. PATENT DOCUMENTS

| 7,088,131 | B1 | 8/2006 | Stout |
| 7,276,932 | B2 | 10/2007 | Kuang et al. |
| 7,385,435 | B2 | 6/2008 | Pham |

(Continued)

FOREIGN PATENT DOCUMENTS

| JP | 2010-153535 | 7/2010 |
| JP | 2011-199113 | 10/2011 |

OTHER PUBLICATIONS

Extended European Search Report in Application No. 12186614.9, dated Oct. 12, 2013, pp. 1-8.

(Continued)

*Primary Examiner* — Lincoln Donovan
*Assistant Examiner* — Jung H Kim
(74) *Attorney, Agent, or Firm* — Meyertons, Hood, Kivlin, Kowert & Goetzel, P.C.

(57) ABSTRACT

A method an apparatus for a power switch acceleration scheme during wakeup is disclosed. In one embodiment, an integrated circuit includes at least one power gated circuit block. The power gated circuit block includes a virtual voltage node from which a voltage is provided to the circuitry of the block when active. Power switches are coupled between the virtual voltage node and a corresponding global voltage node. When the power gated circuit block is powered on, power switches are activated sequentially. The rate at which power switches are activated is increased as the voltage on the virtual voltage node increases. Sequentially activating the power switches may prevent an excess of current inrush into the power gated circuit block. The increase in the rate at which power switches are activated when the voltage on the virtual voltage node is at least at a certain level may allow for a faster wakeup.

13 Claims, 14 Drawing Sheets

(56) References Cited

U.S. PATENT DOCUMENTS

| | | | |
|---|---|---|---|
| 7,479,801 B2 | 1/2009 | Bhattacharya | |
| 7,590,962 B2 | 9/2009 | Frenkil et al. | |
| 7,598,630 B2 | 10/2009 | Burton | |
| 7,659,746 B2 * | 2/2010 | Chua-Eoan et al. | 326/83 |
| 7,873,923 B2 | 1/2011 | Charlebois | |
| 8,179,109 B2 | 5/2012 | Tang et al. | |
| 8,362,805 B2 | 1/2013 | Suzuki et al. | |
| 8,421,499 B2 | 4/2013 | Takayanagi et al. | |
| 2005/0116753 A1 * | 6/2005 | Martelloni | 327/170 |
| 2006/0033551 A1 | 2/2006 | Dong et al. | |
| 2010/0109633 A1 | 5/2010 | Sofer et al. | |
| 2010/0259316 A1 | 10/2010 | Fujita et al. | |
| 2012/0087199 A1 | 4/2012 | Tejada | |

OTHER PUBLICATIONS

Office Action from Japanese Patent Application No. 2012-230297, mailed Dec. 20, 2013, Japanese and English versions, pp. 1-9.

International Search Report and Written Opinion for corresponding International Application No. PCT/US2012/056799, Dec. 6, 2012, pp. 1-9.

Patent Examination Report No. 1 for corresponding Australian Application No. 2012227272, Jul. 17, 2013, pp. 1-3.

Office Action from Korean Application No. 10-2012-109159, mailed Nov. 27, 2013, (English and Korean versions), pp. 1-9.

* cited by examiner

POWER SWITCH ACCELERATION SCHEME FOR FAST WAKEUP

PRIORITY INFORMATION

This application is a continuation application of U.S. application Ser. No. 13/285,269, entitled "Power Switch Acceleration Scheme for Fast Wakeup", filed Oct. 31, 2011, whose disclosure is incorporated herein by reference.

BACKGROUND

1. Field of the Invention

This invention relates to integrated circuits, and more particularly, to integrated circuits having power gated functional blocks.

2. Description of the Related Art

As the number of transistors included on an integrated circuit "chip" continues to increase, power management in the integrated circuits continues to increase in importance. Power management can be critical to integrated circuits that are included in mobile devices such as personal digital assistants (PDAs), cell phones, smart phones, laptop computers, net top computers, etc. These mobile devices often rely on battery power, and reducing power consumption in the integrated circuits can increase the life of the battery. Additionally, reducing power consumption can reduce the heat generated by the integrated circuit, which can reduce cooling requirements in the device that includes the integrated circuit (regardless of whether it is relying on battery power).

Clock gating is often used to reduce dynamic power consumption in an integrated circuit, inhibiting a clock signal from being provided to idle circuitry. While clock gating is effective at reducing the dynamic power consumption, the idle circuitry may nevertheless remain powered on. Leakage currents in the idle transistors lead to static power consumption. The faster transistors (those that react to input signal changes, e.g. on the gate terminals) also tend to have the higher leakage currents which often results in high total leakage currents in the integrated circuit, especially in high performance devices.

To counteract the effects of leakage current, some integrated circuits have implemented power gating. With power gating, the power to ground path of the idle circuitry is interrupted, reducing the leakage current to near zero. There can still be a small amount of leakage current through the switches used to interrupt the power, but it is substantially less than the leakage of the idle circuitry as a whole.

Power gating presents challenges to the integrated circuit design. As blocks are powered up and powered down, the change in current flow to the blocks can create noise on the power supply connections. The noise can affect the operation of the integrated circuit, including causing erroneous operation. Additionally, the rate of change in the current flow varies with variations in the semiconductor fabrication process, the magnitude of the supply voltage provided to the integrated circuit, and the operating temperature of the integrated circuit. When these factors slow the rate of change of the current, the delay incurred in enabling a power gated block may increase correspondingly.

SUMMARY

A method an apparatus for a power switch acceleration scheme during wakeup is disclosed. In one embodiment, an integrated circuit includes at least one power gated circuit block. The power gated circuit block includes a virtual voltage node from which a voltage is provided to the circuitry therein when the block is active. Power switches (e.g., transistors) are coupled between the virtual voltage node and a corresponding global voltage node. When the switches are open, the power is not provided to the power gated circuit block. When the power gated circuit block is woken up (i.e. powered on), the power switches may be activated in a sequential manner. As the voltage on the virtual voltage node increases, the rate at which power switches are activated may also be increased. Sequentially activating the power switches may prevent an excess of current inrush into the power gated circuit block, as well as reducing power supply noise. The increase in the rate at which power switches are activated when the voltage on the virtual voltage node is at least at a certain level may allow for a faster wakeup while still enabling the wakeup sequence to remain within current and noise specifications.

In various embodiments, each of the of power switches may be coupled to one of one or more delay chains. Each delay chain may include a number of serially coupled delay elements. And output of each of the delay elements is coupled to a corresponding one of the power switches (e.g., to the gate terminal of a transistor). An enable signal may be applied to a first one of the delay elements and may propagate through the delay chain, with each of the delay elements therein providing a certain amount of delay. As each delay element outputs the asserted enable signal, its corresponding power switch is activated. Thus, as the enable signal propagates through the delay chain, the power switches are sequentially activated. As the voltage present on the virtual voltage node increases, the amount of delay in the delay elements may be reduced, allowing faster propagation of the enable signal. This in turn may accelerate the rate at which the power switches are activated.

Accelerating the rate of power switch activation may be accomplished in various ways. In one embodiment, reducing the delay of the delay elements (thereby facilitating faster propagation of the enable signal) may be accomplished by the assertion of an indication responsive to circuitry detecting that the voltage magnitude on the virtual voltage node is at or above a certain threshold. Responsive to receiving the indication, the delay elements may reduce the amount of delay provided therein accordingly, thereby accelerating the propagation of the enable signal.

In another embodiment, each of the delay elements may be coupled to directly receive the voltage from the virtual voltage node. The delay elements may be configured such that the delay provided by each is reduced correspondingly with the increasing voltage on the virtual voltage node. The decrease in the delay may be continuous as the voltage present on the virtual voltage node increases. In another embodiment, each of the delay elements may decrease their respective delay responsive to the voltage on the virtual voltage node meeting or exceeding a threshold. The interval between the first power switch enable and the second power switch enable may be predetermined such that the additional current from the second group of power switches does not cause the total current to exceed the max current and max di/dt during only the first group of power switches are enabled at the fast PVT condition.

In still another embodiment, a control unit may activate additional delay chains (and thus additional delay elements) in parallel with other, previously activated delay elements. As more delay elements are activated in parallel, more power switches are activated at a given time, thereby increasing the overall rate at which power switches are activated.

BRIEF DESCRIPTION OF THE DRAWINGS

The following detailed description makes reference to the accompanying drawings, which are now briefly described.

Figure 1:
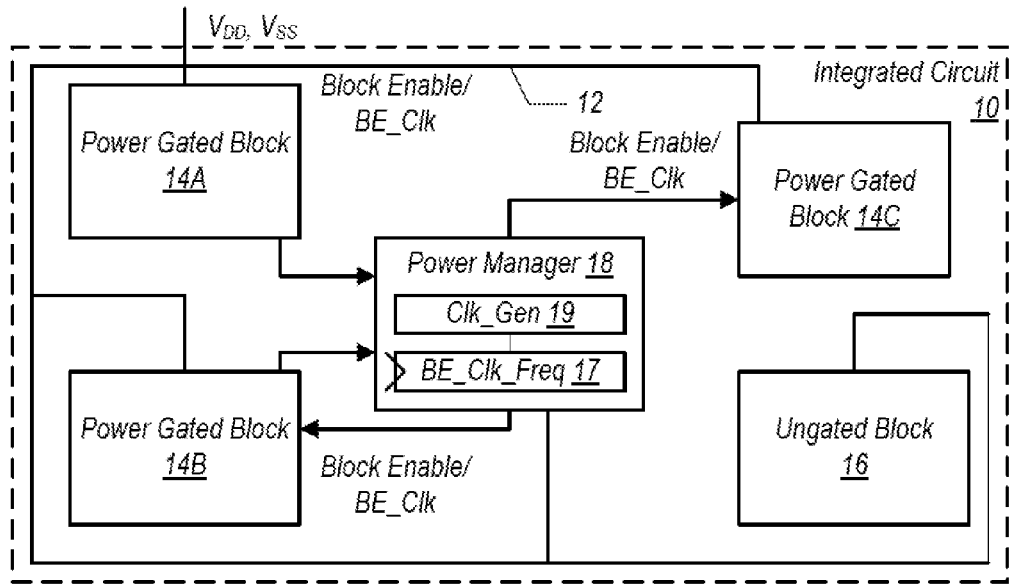
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

The present disclosure is directed to various method apparatus embodiments for powering up power gated functional blocks of an integrated circuit. The integrated circuit may include at least one global voltage node that may be defined as a voltage node coupled to multiple power gated functional blocks. Each functional block may include a corresponding local (or virtual) voltage node that is unique to that functional block. As defined herein, a virtual voltage node is a voltage node that is coupled to a global (e.g., supply) voltage node when one or more power switches (e.g., transistors) coupled therebetween is activated. When a power gated functional block is actively receiving power, the power switches coupled between the virtual and global voltage nodes may be activated, and the virtual voltage node may be at or near the same voltage as the global voltage node. When a power gated functional block is inactive while the supply voltage node is otherwise receiving power, the power switches coupled between the virtual and supply voltage nodes may be inactive, and the virtual voltage node may be at or near a reference (e.g., ground) voltage.

Integrated Circuit with Power Gated Functional Blocks:

Turning now to FIG. 1, a block diagram of one embodiment of an integrated circuit 10 is shown. The integrated circuit 10 is coupled to receive power supply inputs (e.g. VDD and VSS, or power and ground, respectively). The VDD voltage may have a specified magnitude measured with respect to ground/VSS during use. More particularly, the VDD voltage may have a number of magnitudes that may be used for different operating points of the integrated circuit 10 during use. The integrated circuit 10 may include an interconnect, e.g. a global power supply grid, for each supply voltage, to distribute the voltage over an area occupied by the integrated circuit 10 (e.g. an area at the surface of a semiconductor substrate such as silicon). The global power supply grids are illustrated in FIG. 1 as the line 12 coupled to the blocks 14A-14C, 16, and 18 in FIG. 1. However, the grids may physically be arranged in a somewhat regular fashion.

The integrated circuit 10 may include one or more power gated circuit blocks such as blocks 14A-14C. Each block 14A-14C may include circuitry such as transistors that are arranged to implement the desired operations of the integrated circuit 10, and thus may be circuit blocks (although sometimes referred to herein as simply "blocks" for brevity). For example, the blocks 14A-14C may be processors or portions thereof (e.g. execution units within the processors); interface circuitry; peripheral circuitry such as graphics processing circuitry; user interface circuitry; multimedia circuitry such as audio and/or video processing circuitry; etc.

Generally, a circuit block may include a set of related circuits that implement one or more identifiable operations. The related circuits may be referred to as logic circuits or logic circuitry, since the circuits may implement logic operations on inputs to generate outputs. Because the circuits in a given circuit block are related, they may be powered up or powered down as a unit. Each circuit block may generally be treated as a unit during the design of the integrated circuit (e.g. being physically placed within the integrated circuit as a unit). The circuit block may further include memory circuitry (e.g. various static random access memories, or SRAMs) and other storage devices that are part of the logic circuitry.

A power gated circuit block (or simply a power gated block) may be a circuit block that may have at least one of its power supply voltages (VDD or VSS) interrupted in response to deassertion of a block enable input signal. The power gated blocks may include power switches that are coupled to the global power supply grid and to a local power supply grid. If the enable is asserted, the power switches may electrically connect the global and local power supply grids. If the enable is deasserted, the power switches may electrically isolate the global and local power supply grids. When electrically connecting the grids, the power switch may be referred to as being on, and when electrically isolating the grids, the power switch may be referred to as being off. The voltage on the global power supply grid may appear on the local supply grid when electrically connected. However, the switches may have some impedance, and thus the voltage on the local power supply grid may differ from the voltage on the global power supply grid. The local supply voltage may be referred to as "virtual" (e.g. virtual VDD or virtual VSS).

When a power gated block 14A-14C is enabled, the power switches turn on and current flows to charge the local power supply grid in the power gated block 14A-14C. In order to reduce the rate of change of current (di/dt) on the global power supply grids, which may generate enough noise to cause erroneous behavior in other circuitry in some cases, the power gated block 14A-14C may control the rate at which switches are activated. Various schemes, which will be discussed in further detail below, may be used to control the activation rate of the power switches for a given block.

In the illustrated embodiment, the power gated blocks 14A-14C may receive a clock signal (BE_Clk in FIG. 1) in addition to the block enable. The clock signal may be used for certain power switch activation schemes to provide control over the rate at which switches may be activated. This in turn may enable the rate of change of the current may be controlled to acceptable levels, in some embodiments. More particularly, in certain embodiments the power gated block 14A-14C may include one or more timers that are synchronized to the BE_Clk signal. The timers may enable certain groups of switches to be activated after a predetermined time has elapsed.

In the illustrated embodiment, the power manager 18 may include a clock generator circuit 19 that generates the BE_Clk clock. The frequency of the clock may be programmable (e.g. via software executing on a processor within the IC 10 or coupled to the IC 10) via the BE_Clk_Freq register 17 coupled to the clock generator circuit 19. In some embodiments, the programmed frequency may be independent of process/voltage/temperature (PVT) conditions in the integrated circuit. For example, the delay for power switches enabled by a timer in the power gated block may be determined for the fastest PVT conditions, and a frequency corresponding to ½ of the delay may be selected as the programmable frequency. Additional details for some embodiments are provided below. In other embodiments, the frequency programmed into the register 17 may be based on an indication of the process parameters that were in place when the integrated circuit 10 was manufactured (e.g. the parameters may indicate a "fast" process, a "typical" process, or a "slow" process). The frequency may be also be based on the current supply voltage magnitude. A lower voltage may lead to slower transistor operation, reducing the di/dt effect as compared to higher voltages and thus permitting a higher frequency, if desired. In some embodiments, the frequency may also be based on operating temperature. A higher operating temperature may lead to slower transistor operation, reducing the di/dt effect as compared to lower temperatures and thus permitting a higher frequency, if desired. The clock generator circuit 19 may be any type of clock generator (e.g. a phase locked loop, a clock divider receiving an input clock and dividing it in frequency, a clock multiplier, etc.).

It is noted that not all of the power switch activation schemes to be described below utilize a clock signal. Accordingly, in some embodiments, one or more of the power gated block are not coupled to receive the BE_Clk signal. Furthermore, embodiments that do not use the BE_Clk signal for any of the power gated blocks are also possible and contemplated. Examples of such embodiments will be discussed below.

A power manager 18 is coupled to the blocks 14A-14C and 16, and may be configured to monitor the activity in the blocks 14A-14C and 16 to generate the block enables for the power gated blocks 14A-14C. The activity in one block may be an indicator that another block is about to become active and should be powered up. For example, the blocks 14A-14C and 16 may be part of a pipeline. If one pipeline stage is active, it may be likely that the next stage will be active soon. Similarly, in a processor, a fetch request may indicate that instructions will be fetched and decoded soon, and thus the execution units may be powered up. Power gated blocks may be components of a system on a chip, and a communication from one component to another may indicate that a block may need to be powered up. Activity in a block may also indicate that the block or another block is about to be idle and may be powered down. While the ungated block may not be enabled or disabled for power gating, its activity may be useful in determining if the power gated blocks may be disabled. In some embodiments, clock gating may be implemented in addition to power gating. In such embodiments, the power manager 18 may also implement the clock gating, or the clock gating may be implemented separately. While the power manager is shown as a block in FIG. 1, the power manager 18 may actually be distributed as desired.

Generally, the power manager 18 may be configured to deassert the block enable to power down a block, and to assert the block enable to power up a block. The block enable (and other signals described herein) may be asserted at one logical state and deasserted at the other logical state. For example, the signal may be asserted (indicating enable) at a low logical state (binary zero) and deasserted at a high logical state (binary one). The signal may alternatively be deasserted at the low logical state and asserted at the high logical state. Different signals may have different asserted/deasserted definitions. In some contexts, a signal may be referred to as asserted low, or alternatively asserted high, for additional clarity.

In various embodiments, a period of time may elapse after a power gated block 14A-14C has its block enable deasserted before the supply voltage has drained, and there may be a period of time after assertion of the enable before the power gated block is considered stable and ready for use. The power manager 18 may be configured to account for these times when determining if the block enable may be deasserted, and in determining when to reassert the block enable for the next power up of the block.

The electrical isolation of the local and global power supply grids that may be provided by the power switches may generally refer to a lack of active current flow between the grids. The power switches themselves may have leakage current, so there may be some leakage current flow. Similarly, the electrical connection of the local and global power supply grids may refer to an active current flow between the grids to provide the voltage from the global grid to the local grid. Viewed in another way, electrically connected grids may have a very low impedance path between them, whereas electrically isolated grids may have a very high impedance path. Viewed in still another way, electrically connected grids may be actively passing a voltage from one grid to the other, wherein electrically isolated grids may be preventing the passing of the voltage.

The local and global power supply grids may generally distribute a power supply voltage over various areas of the integrated circuit 10. The global power supply grids distribute the voltage over the entire area of the integrated circuit 10, while local power supply grids distribute power supply voltages within a power gated block. The ungated blocks may also include local power supply grids, but since they do not include power switches, the local power supply grids may essentially be part of the global power supply grid. In general, the power supply grids may have any configuration. For example, in one embodiment, a given block may have power supply connections to the underlying circuitry at certain physical locations (e.g. regularly spaced channels over the area). The power supply grids may include wiring running above these regularly spaced channels. There may also be wires running in the orthogonal direction to the wiring, to reduce impedance and to supply current to any localized current "hot spots". Other grids may include any sort of distribution interconnect and/or there may be irregularities in the grids, or the interconnect may essentially be a plane of metal. In one embodiment, the global power supply grids may be provided in one or more of the highest layers of metal (wiring layers), i.e. those layers that are farthest from the surface of the semiconductor substrate. The local power supply grids may be included in lower layers of metal. Connections between the power supply grids may be made to the power switches at a surface of the semiconductor substrate. The metal may be any conductive material used for interconnect in the semiconductor fabrication process used to fabricate the integrated circuit 10. For example, the metal may be copper, aluminum, tungsten, combinations thereof (e.g. aluminum or copper wiring layers and tungsten vias), alloys thereof, etc.

The power supply voltages (VDD and VSS) may generally be externally supplied to the integrated circuit, and may be generally intended to be relatively static during use. While the magnitude of the supply voltages may be intentionally changed during use (e.g. for power management), the magnitude changes are not intended to be interpreted by receiving circuits in the fashion that dynamically varying signals are interpreted. Similarly, local variations in the power supply voltages may occur (such as VDD droop or VSS bounce) during operation, but these variations may generally be undesirable transients. The power supply voltages may serve as sources and sinks of current as the circuitry evaluates.

As mentioned above, the power gated blocks 14A-14C may have their power gated, e.g. when inactive, to reduce power consumption in the integrated circuit. According, the power gated blocks 14A-14C are each coupled to receive an enable signal (block enable in FIG. 1). The block enable signal for each block may be a separate, unique signal for that block, so that the power gated blocks 14A-14C may be individually enabled or not enabled. In some cases, one or more power gated blocks may share an enable. A shared block enable may be physically the same signal, or logically the same signal (i.e. the signals are physically separate by logically operated the same way). The integrated circuit 10 may also include one or more ungated circuit blocks such as ungated block 16. Ungated blocks may be coupled to the power supply grids 12 without any power switches, and thus may be powered up whenever the integrated circuit 10 is powered up. Ungated blocks may be blocks that are active most or all of the time, so that including the power switches and attempting to power gate them is not expected to produce much power savings, if any, for example.

It is noted that, while one ungated block and three power gated blocks are shown in FIG. 1, there may generally be any number of one or more power gated blocks and ungated blocks, in various embodiments. Similarly, there may be more than one power manager 18 in the integrated circuit 10 (e.g. enabling/disabling various non-overlapping subsets of the power gated blocks).

It is noted that one or more circuit blocks may include state storage (e.g. memory, flops, registers). It may be desirable to retain the state in the state storage (or some of the state storage). In such cases, the global power grids may supply power to the state storage without power switches in the power to ground path. A separate local power grid may be provided, for example, without power switches.

Figure 2:
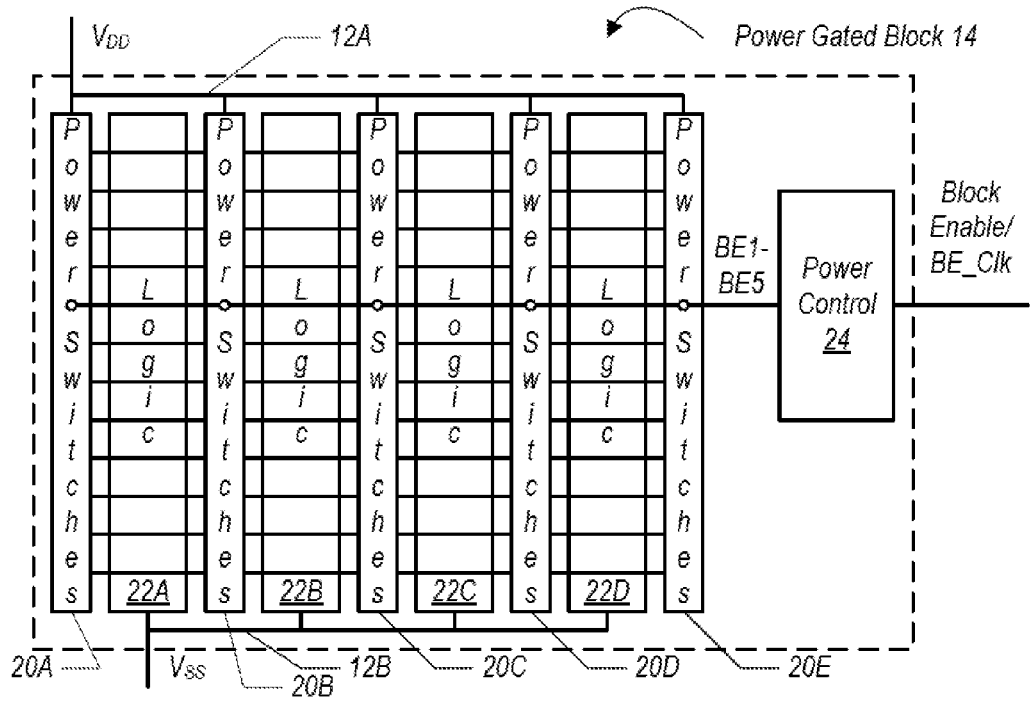
FIG. 2 is a block diagram of one embodiment of a power gated block shown in FIG. 1.

Turning now to FIG. 2, a block diagram of one embodiment of the power gated block 14 is shown. Power gated block 14 may be similar to any of the power gated blocks shown in FIG. 1. In the embodiment of FIG. 2, the power gated block 14 includes multiple power switches located at a variety of physical locations within the power gated block 14, as illustrated. That is, the power switches may be physically distributed over the area occupied by the power gated block 14. In this embodiment, the power switches are placed at regularly spaced intervals, although other distributions that are not regular may be used in other embodiments. Each location may include multiple power switches (e.g. power switch segment 20A may include multiple power switches). The power switches at one location may be referred to as a segment of power switches 20A-20E. The power gated block 14 further includes a power control circuit 24. The power control circuit 24 is illustrated as a block in FIG. 2, but may be physically distributed near the locations of the power switch segments in some embodiments. The block enable and BE_Clk for the power gated block 14A may be coupled to the power control circuit 24. The power control circuit 24 is coupled to each of the power switch segments 20A-20E, supplying each segment with a respective local block enable (BE1 to BE5 in FIG. 2).

In this embodiment, the power switches are coupled between the global VDD grid 12A and the local VDD grid of the power gated block 14. The local VDD grid is illustrated as the horizontal lines in FIG. 2 between the power switch segments 20A-20E. Between each of the power switch segments 20A-20E, logic circuits 22A-22D are provided. The logic circuits 22A-22D may be powered by the local VDD grid, and also by the local VSS grid which is not shown in FIG. 2. The global VSS grid 12B is shown coupled to each of the logic circuits 22A-22E, but there may generally be a local VSS grid to which the global VSS grid 12B is coupled. While FIG. 2 shows the power switch segments 20A and 20E at the edges of the power gated block 14 with no circuitry between the edges of the power gated block 14 and the power switch segments 20A and 20E, these power switch segments may not necessarily be placed at the very edges. In other words, logic circuits may be placed to the left of the power switch segment 20A in FIG. 2 and/or to the right of power switch segment 20E in FIG. 2.

The power control circuit 24 may generate the local block enables BE1-BE5 for the segments responsive to the block enable and BE_Clk from the power manager 18. Particularly, the power control circuit 24 may stagger the local block enable assertions. For example, the power control circuit 24 may assert one local block enable per clock cycle of the BE_Clk. In other embodiments, more than one local block enable may be asserted per clock cycle, as long as the di/dt effects of enabling more than one segment per clock cycle are below design limits. Furthermore, in some embodiments, there may be more than one local block enable per segment, and the local block enables for a given segment may be staggered. The number of segments and local block enables in a power gated block may be varied and may be more or fewer than that shown in FIG. 2.

The power switches may generally comprise any circuitry that may electrically connect a local power supply grid to a global power supply grid in response to an asserted enable signal and may electrically isolate the local power supply grid from the global power supply grid in response to a deasserted enable signal. For example, each power switch may be a P-type Metal-Oxide-Semiconductor (PMOS) transistor for embodiments that implement power switches on the VDD power supply grid. The gate of the PMOS transistor may be coupled to receive the (possibly buffered) local block enable signal (BE1-BE5 in FIG. 2), a source coupled to the global VDD grid 12A, and a drain coupled to one or more local VDD grid lines. Accordingly, the block enable signal may be asserted low in this example, turning the PMOS transistor 24 on and actively conducting current from the global VDD grid 12A to the local VDD grid lines. Embodiments which implement the power switches on the VSS grid may be similar, except that the transistor may be an N-type MOS (NMOS) transistor and the block enable may be asserted high/deasserted low in such embodiments.

Figure 3:
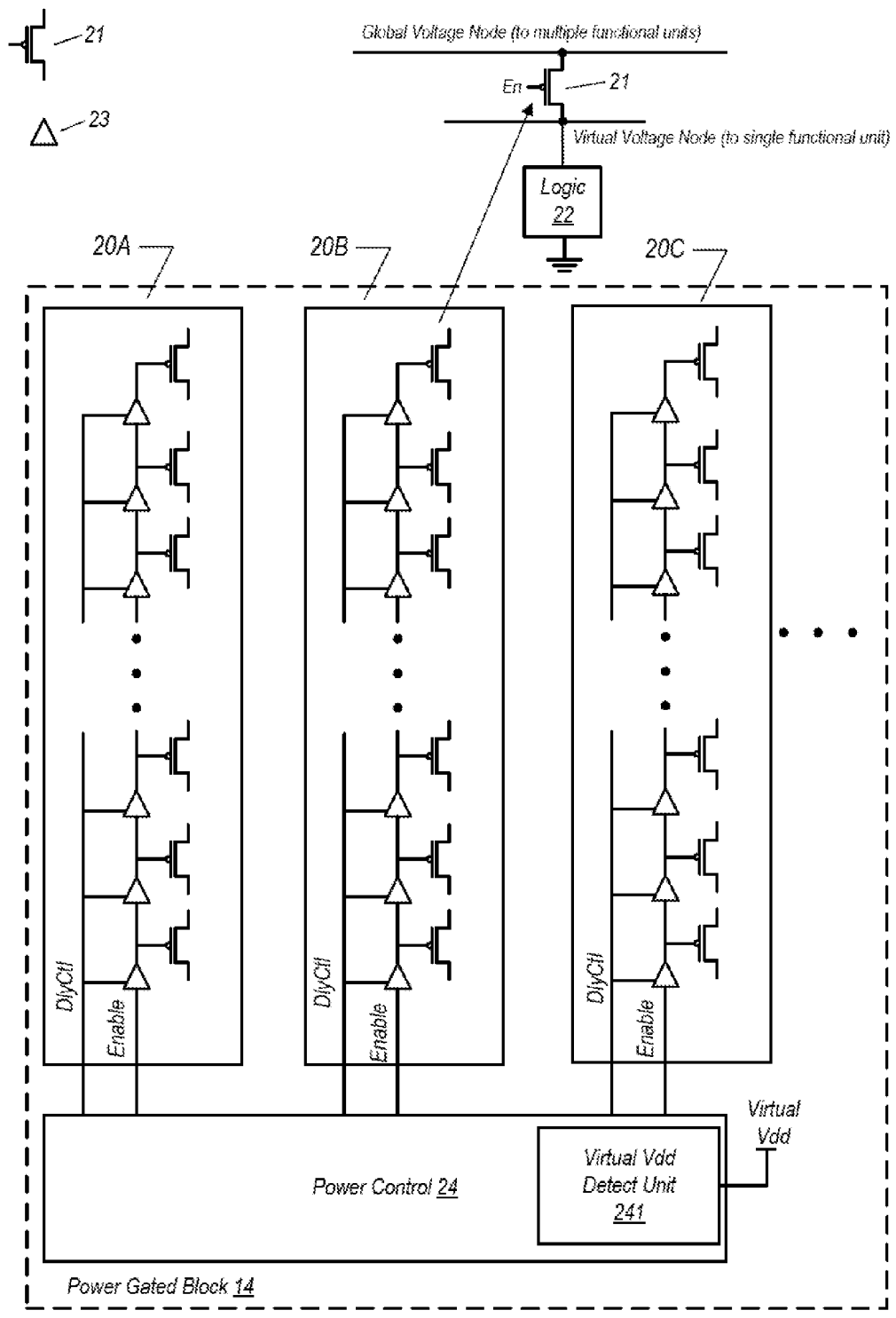
FIG. 3 is a diagram of one embodiment of a power gated block in which the rate of activation of power switches is accelerated during a wakeup procedure.

Power Switch Acceleration Scheme:

Turning next to FIG. 3, an embodiment of a power gated block 14 that utilizes an acceleration scheme during a power on procedure is illustrated. For the sake of simplicity, only the power switch segments (e.g., power switch segments 20A-20C) are shown in this and the remaining figures, while the logic circuits are not shown within power gated block 14. Furthermore, some external connections (e.g., block enable inputs) may be eliminated from some of the subsequent drawings for the sake of simplicity.

The power switch acceleration scheme utilized by this example of power gated block 14 is one in which the rate of activation of power switches is increased during the power on procedure. Initially, power switches may be activated at a first rate. As the voltage increases on the virtual VDD, the rate at which power switches are activated may be increased.

During a power up procedure, the amount of current often times does not increase linearly or in proportion to the voltage on the virtual VDD node. More particularly, the rate of current change, di/dt, is not typically sustained at a constant value during the power up procedure. As the voltage on the virtual VDD node increases, the di/dt may rise to a peak and then begin falling. The peak may be reached at a voltage that is less than the final voltage of the virtual VDD node upon completion of powering up power gated block 14. Accordingly, once the voltage corresponding to the peak di/dt has passed, it may be possible to increase the rate at which power switches are activated while remaining within di/dt limits. Accordingly, power on/wakeup time for a functional block may be reduced relative to an embodiment wherein the power switches are activated at a constant rate throughout.

In the embodiment shown in FIG. 3, power switches are implemented as transistors 21 (PMOS transistors in this case). The respective gate terminals of each of the transistors 21 is coupled to an output of a corresponding of delay elements 23. The delay provided by each of the delay elements 23 in this embodiment is controllable by power control unit 24, which is local to power gated block 14. Within each power switch segment 20A-20C, the delay elements 23 are serially coupled to one another to form delay chains. When an enable signal is input into a delay chain, it propagates through respective delay elements 23 and thus causes the power switches in that power switch segment to be sequentially activated.

Power control unit 24 in the embodiment shown includes a virtual VDD detection unit 241, which is configured to detect a voltage level on the virtual VDD node. When the voltage on the virtual VDD node reaches or exceeds a predetermined threshold value, power control unit 24 may adjust the respective delay for each of delay elements 23.

Each of the delay elements 23 in the embodiment shown is coupled to receive a delay control signal ('DlyCtl') from power control unit 24. In some embodiments, the delay control signal may be a digital signal. In such embodiments, assertion of this digital signal may cause the delay of each of delay elements 23 to be reduced from a first value to a second value. When the delay is reduced, the speed of propagation of the enable signal through the delay chain increases. Correspondingly, the rate of activation of power switches 21 also increases.

In another embodiment, the delay control signal may be an adjustable voltage. The delay provided by each of delay elements 23 may be based on the voltage of the delay control signal. Accordingly, responsive to determining that the virtual VDD voltage is equal to or greater than a threshold voltage, power control unit 24 may adjust the voltage of the delay control signal in order to cause a reduction of the delay provided by each of delay elements 23. The reduction may be from a first fixed value (prior to the virtual VDD voltage reaching the threshold) to a second fixed value. However, embodiments are also possible and contemplated wherein the voltage of the delay control signal, and thus the delay of delay elements 23, is reduced from the first value in a continuous manner after the virtual VDD voltage has reached the threshold value. In such a case, the rate of activation of power switches 21 may continuously increase until all of them are active.

In this particular example, the power switches are divided into three separate power switch segments 20A-20C. Accordingly, activation of the power switches 21 in each of the power switch segments 20A-20C may proceed in parallel with respect to the other power switch segments (but sequentially within a given segment). In another embodiment, power control unit 24 may activate the power switches 21 of power switch segments 20A-20C sequentially. For example, power control unit 24 may provide the enable signal first to power switch segment 20A, then to power switch segment 20B, and so on. Other embodiments as possible and contemplated in which each of the power switches 21 are consolidated into a single power switch segment 20, with a single delay chain of serially coupled delay elements 23.

Figure 4A:
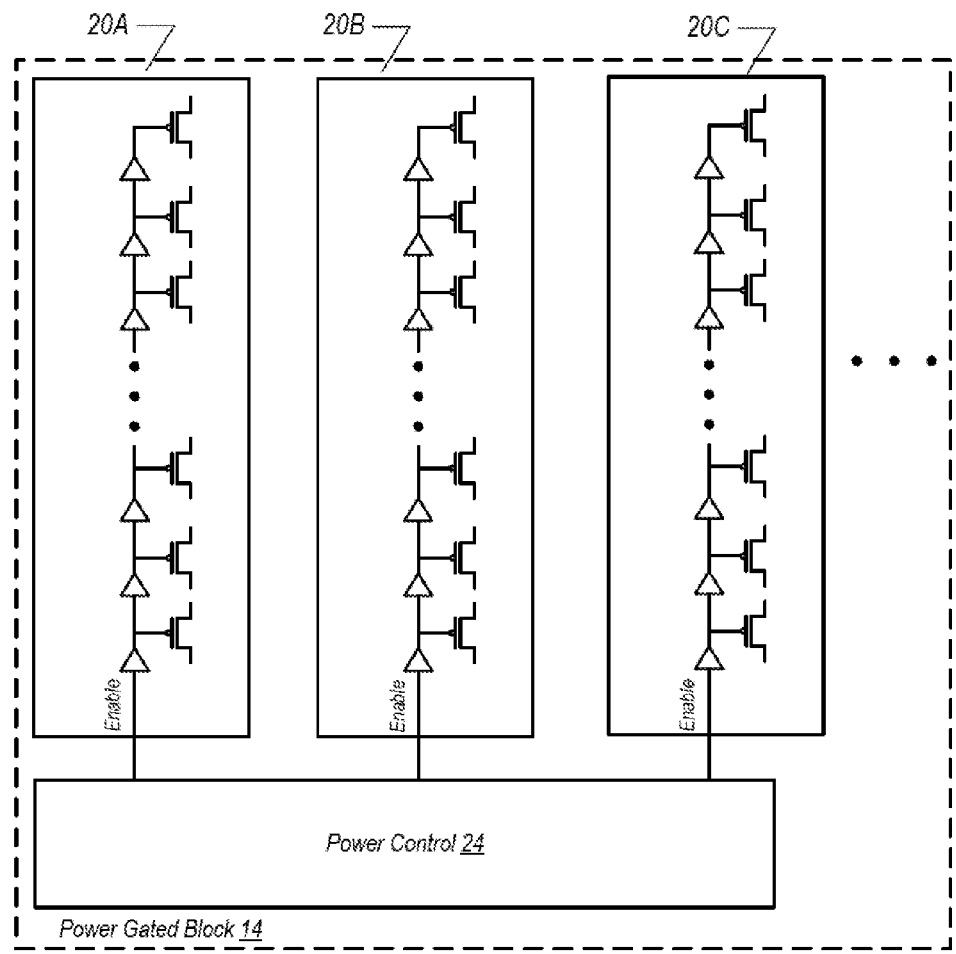
FIG. 4A is a diagram of another embodiment of a power gated block in which the rate of activation of power switches is accelerated during a wakeup procedure.

FIG. 4A is a block diagram of another embodiment of a power gated functional block 14. In this particular embodiment, each of delay elements 23 is self-adjusting with respect to the amount of delay provided. Accordingly, power control unit 24 in this embodiment is not configured to assert a delay control signal, nor are delay units 23 coupled to receive the same.

Figure 4B:
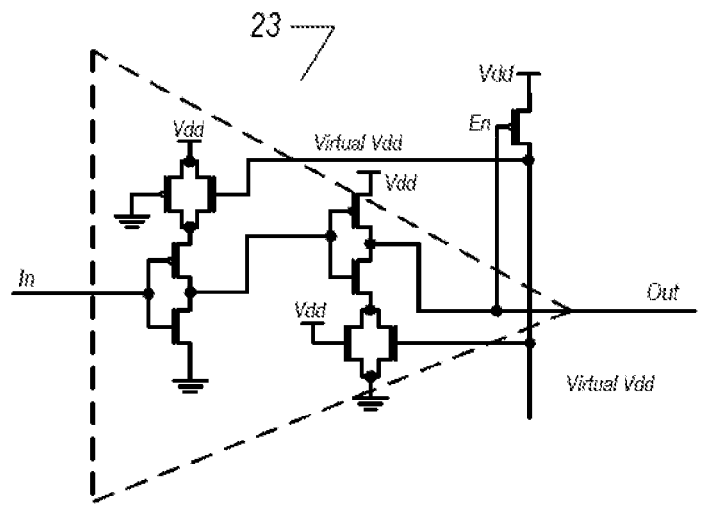
FIGS. 4B, 4C and 4D are diagrams illustrating various embodiments of a delay element.
Figure 4C:
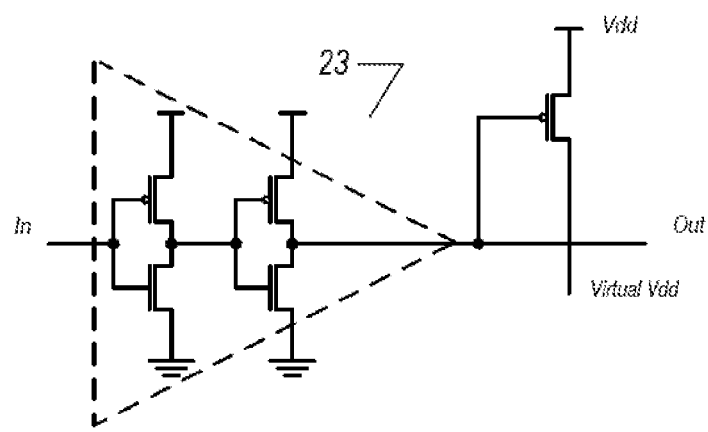
Figure 4D:
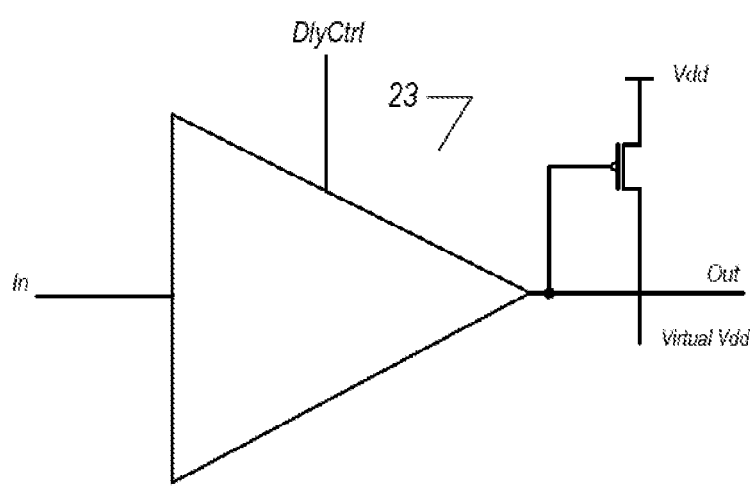

Exemplary embodiments of delay element 23 are shown in FIGS. 4B, 4C, and 4D. In the embodiment shown in FIG. 4B, each delay element 23 is coupled to directly to the virtual VDD node. More particularly, each delay element 23 of FIG. 4B includes two NMOS transistors having gate terminals directly coupled to receive the voltage on the virtual VDD node. The first of these NMOS transistors is part of a passgate circuit in the pull-up path corresponding to the input of delay element 23. The second NMOS transistor is part of a passgate in the pull-down path associated with the output node of delay element 23. The other transistors in the respective passgates have gate terminals hardwired such that they are always active. The NMOS transistors having gate terminals to virtual VDD in this embodiment may operate in their respective linear regions for at least part of the power on procedure. As the voltage on the virtual VDD node increases, the current through these NMOS transistors may correspondingly increase. As a result, the switching delay through the pull-up path associated with the input and the pull-down path associated with the output is correspondingly reduced. As the delay through each delay element 23 is reduced, the speed at which an enable signal propagates through the delay chain increases, thereby increasing the rate at which switches 21 are activated.

In the embodiment of FIG. 4A, delay elements 23 (which may be those shown in FIG. 4B) are configured to continuously change their respective delay as the voltage on the virtual VDD node changes. However, embodiments of a delay element 23 are also possible and contemplated wherein each delay element is configured to provide at least one fixed delay (e.g., a fixed amount while the voltage on virtual VDD is less than a threshold voltage), such as in FIG. 4C. Embodiments of a delay element 23 having a delay that is controlled via an externally received control signal, such as those in FIG. 4D, are also possible and contemplated. In general, a wide variety of embodiments of delay elements 23 are possible and contemplated. Furthermore, it is noted that embodiments of power gated blocks that utilize multiple types of delay elements 23 are possible and contemplated.

As with the embodiment of power gated block shown in FIG. 3, power switches 21 and delay elements 23 in the embodiment of FIG. 4A are arranged in different power switch segments 20A-20C. As such, power control unit 24 may assert enable signals to each of these segments individually and sequentially, in parallel, or in a manner where multiple segments are activated concurrently but not necessarily in parallel, depending on the specific implementation. Furthermore, the power switches 21 and delay elements 23 may be consolidated into a single segment with a single delay chain.

Figure 5:
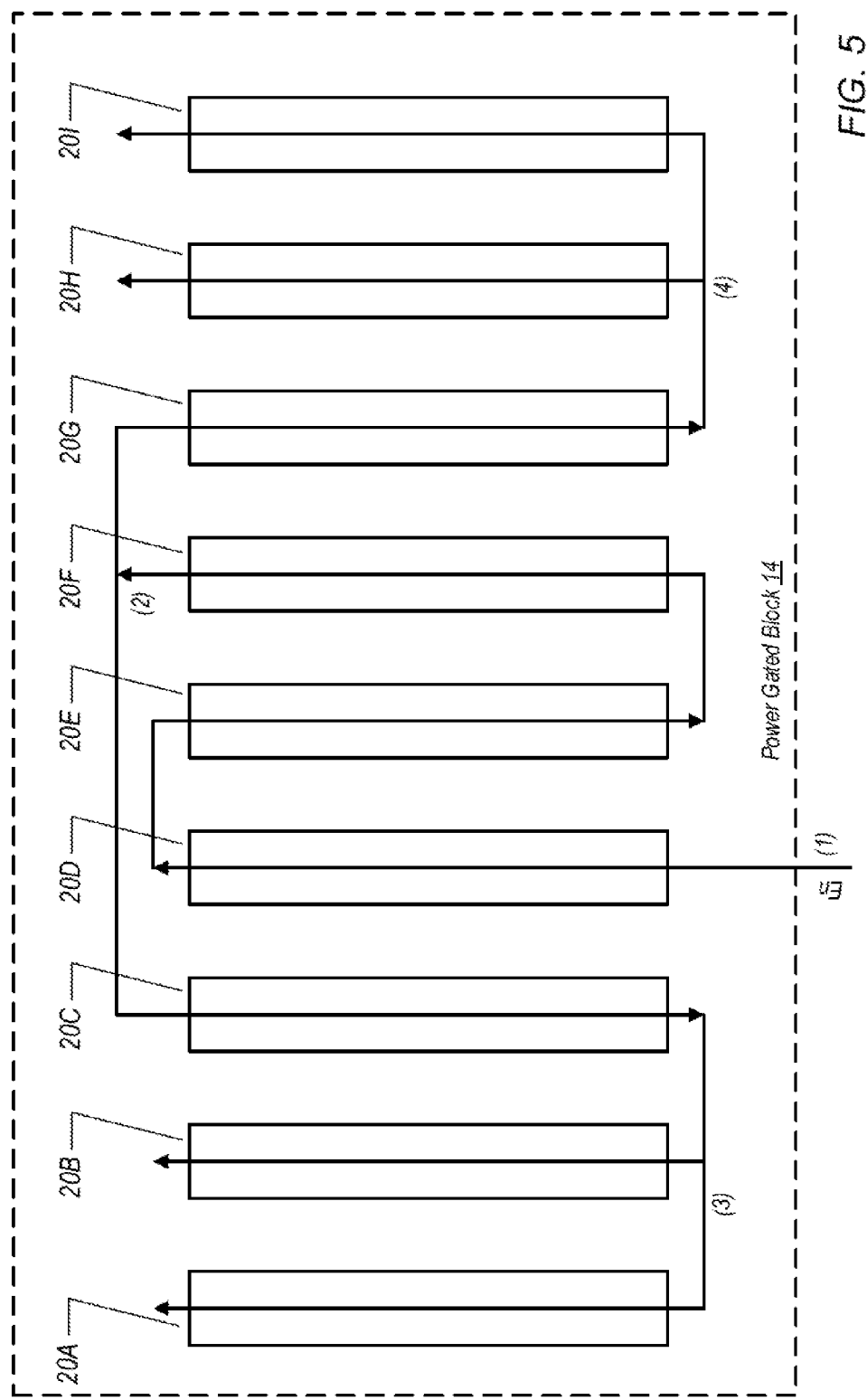
FIG. 5 is a diagram of a third embodiment of a power gated block in which the rate of activation of power switches is accelerated during a wakeup procedure.

Another embodiment of a power gated block 14 in which the rate of power switch activation is accelerated is shown in FIG. 5. The embodiment shown in FIG. 5 may include a power control unit 24, although it is not shown here for the sake of illustration. Similarly, the details of each power switch segment 20A-20I are not shown here. However, these power switch segments may be configured similarly to the power switch segments of the previously discussed embodiments. Furthermore, each of power switch segments 20A-20I may be uniformly constructed. It is further noted that a hardwired embodiment of a power gated block 14 shown in FIG. 5 that does not utilize control information from a power control unit 24 is also possible and contemplated.

In this particular embodiment, activation of power switches begins at (1) with the assertion of an enable signal to power switch segment 20D. Initially, the enable signal propagates sequentially through power switch segment 20D, through segment 20E, and then through segment 20F. Assuming that the delay of the delay elements 23 in each of the power segments has a relatively constant delay, the overall rate at which power switches are activated is similarly constant as the enable signal propagates through power switch segments 20D-20F.

At (2), the enable signal is provided to both of power switch segments 20C and 20G. At this point, the enable signal is effectively propagating through two separate delay chains in parallel with one another. This in turn doubles the rate of power switch activation relative to the previous point in which the enable signal propagated through only single ones of the power switch segments.

At (3) and (4), which may occur simultaneously or in close temporal proximity to one another, the rate of power switch activation may double yet again. At (3), the enable signal is propagated into parallel power switch segments 20A and 20B. Similarly, at (4), the enable signal is propagated into power switch segments 20H and 20I. Thus, at this point, the enable signal is propagating through four different power switch segments in parallel. Accordingly, the rate of activation of power switches is four time that of its initial rate.

The exact manner in which the enable signal propagates through the power segments may vary from one embodiment to another. For example, a path for the enable signal may be connected as depicted in the embodiment of FIG. 5. In another embodiment, power control unit 24 may selectively choose which of the power switch segments are to receive an enable signal at a given time. In one contemplated embodiment, the technique of detecting the voltage on the virtual VDD node may be combined with the technique shown in FIG. 5. Accordingly, power control unit 24 may enable single instances of a power switch segment until the voltage on the virtual VDD node reaches a threshold value. Multiple segments may be concurrently enabled thereafter to increase the rate at which power switches are activated.

Figure 6:
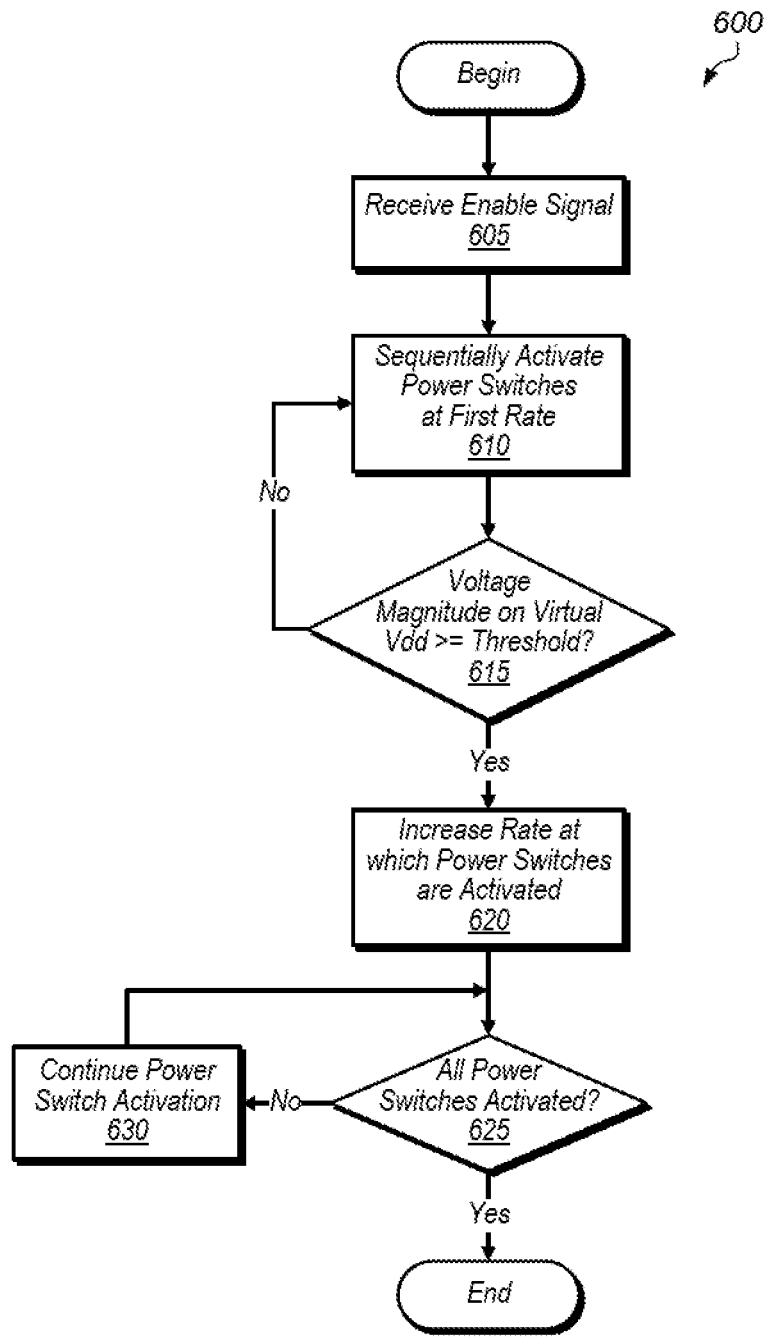
FIG. 6 is a flow diagram illustrating a method embodiment of accelerating the rate at which power switches of a functional block are activated during a wakeup procedure.

FIG. 6 is a flow diagram illustrating one embodiment of a method for increasing the rate at which power switches are activated during a power on procedure. Method 600 begins with a power gated functional block receiving an enable signal (block 605). The enable signal may be received from a chip-level power management unit in some embodiments. The power gated functional block may include its own internal power control unit, which may be used to provide local control of the activation of power switches therein.

Subsequent to receiving the enable signal, the activation power switches within the functional block may begin (block 610). The activation of the power switches may occur sequentially within given power switch segments, as described above in reference to FIGS. 3-5. The activation of the power switches may initially occur at a first rate.

During the activation of power switches in the embodiment shown, the voltage on the virtual VDD node is compared to a threshold voltage (block 615). If the voltage on the virtual voltage node is less than the threshold voltage (block 615, no), then activation of the power switches continues at a first rate (block 610). If the voltage on the virtual voltage node is greater than or equal to the threshold voltage (block 615, yes), then the rate at which power switches are activated is increased to a second rate that is greater than the first (block 620). The activation of power switches may continue at the second rate as long as there are power switches that remain inactive. If all power switches are not active (block 625, no), then power switch activation continues (block 630). If all power switches have been activated (block 625, yes), then the method is concluded.

It is noted that the comparison of the voltage from the virtual VDD node to a threshold voltage may not be included in all embodiments. For example, the power switch acceleration scheme implemented by the embodiments shown in either of FIGS. 4 and 5 may be implemented without comparing the virtual VDD node voltage to a threshold voltage. Furthermore, while the embodiment of method 600 shown here refers to first and second rates of power switch activation, it is noted that embodiments using different rates are possible and contemplated. Moreover, method embodiments in which the rate of power switch activation is increased in a continuous manner are possible and contemplated.

Figure 7:
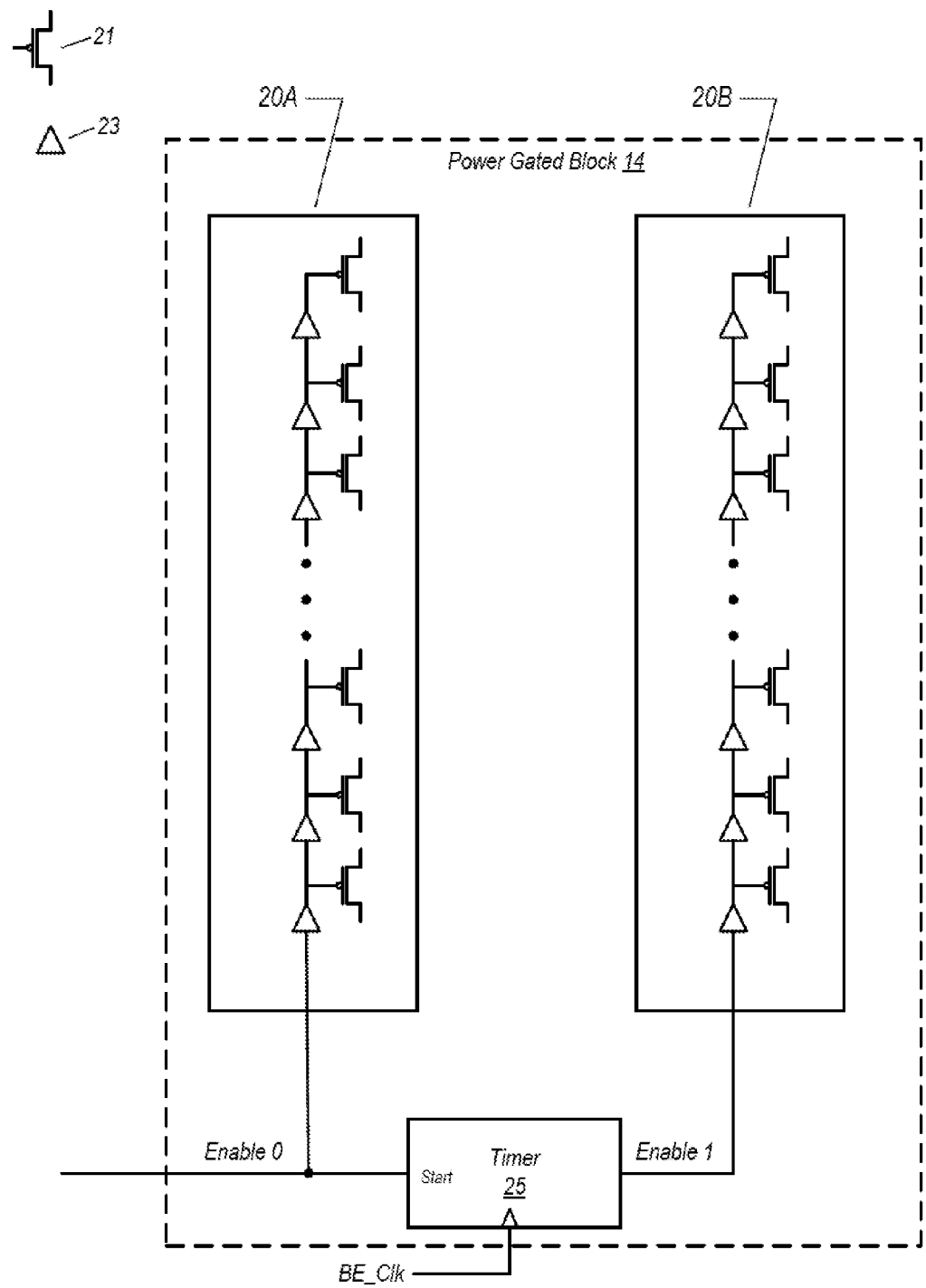
FIG. 7 is a block diagram of one embodiment of a functional block having separate delay chains coupled to activate power switches.
Figure 8:
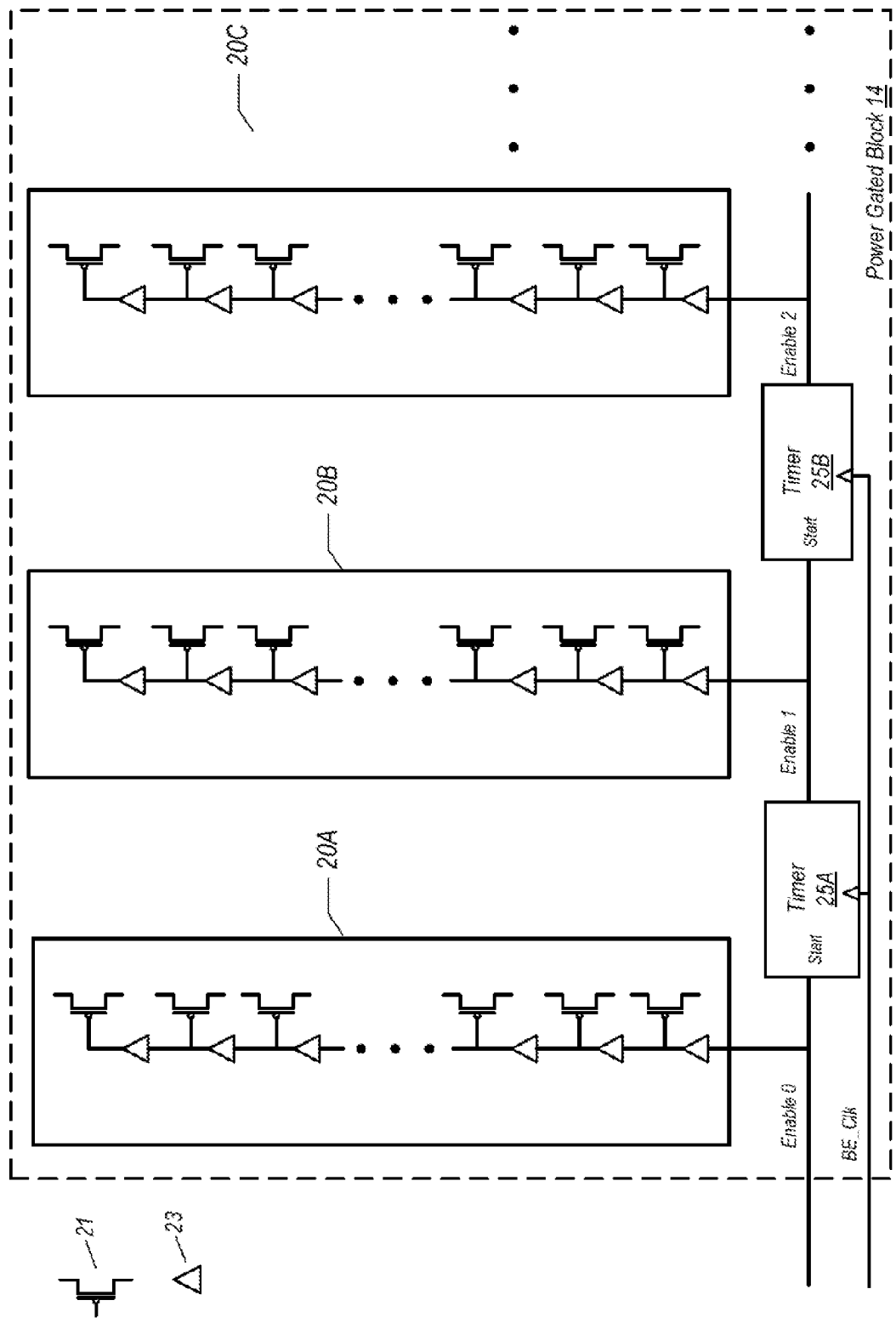
FIG. 8 is a block diagram of another embodiment of a functional block having separate delay chains coupled to activate power switches.
Figure 9:
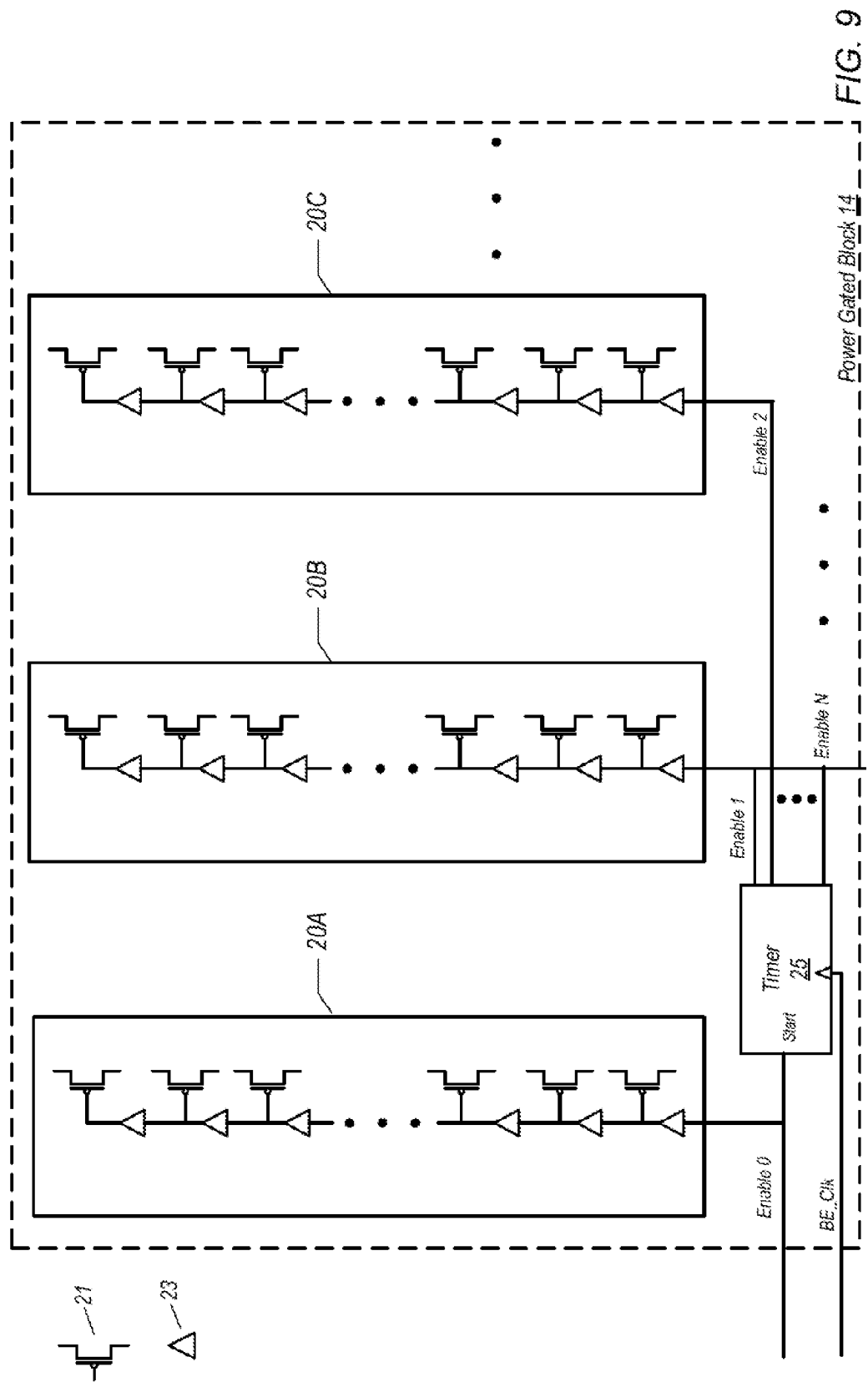
FIG. 9 is a block diagram of a third embodiment of a functional block having separate delay chains coupled to activate power switches.

Multi-Path Power Switch Scheme for Functional Block Wakeup:

FIGS. 7-9 illustrate various embodiments of a power gated block in which activation of power switches during a power on procedure/wakeup is subdivided by path. More particularly, in each of the embodiments to be illustrated in FIGS. 7-9, respective enable signals are provided to different power switch segments at different times to control di/dt during the powering on of the functional block.

In some cases, the activation of power switches in one segment may overlap the activation of power switches in other segments. In other cases, there is no overlap between the activation of power switches in one segment and those of another segment. Overlap may depend on PVT variations in the integrated circuit upon which the power switch segments are implemented. In the fastest cases (i.e., fastest switching times due to PVT variations), overlap is less likely to occur. In slower cases (i.e. slower switching times due to PVT variations), overlap is more likely to occur. In either case, di/dt may be held to within specified limits. In the fastest cases, since there may be no overlap, only one power switch segment is powered up at a time. Thus, the di/dt is limited to that resulting from the activation of power switches in only a single segment. In the slower cases, while some overlap may occur, the power switches in each segment may be activated at a slower rate. Thus, since the power switches are activated at a slower rate, di/dt may be held within specified limits.

Turning now to FIG. 7, a diagram illustrating one embodiment of a power gated block utilizing a multi-path power switching scheme. In the embodiment shown, power gated functional block 14 includes two power switch segments, 20A and 20B. Each of power switch segments are generally constructed in the same manner as previously described embodiments, each including a delay chain and a number of power switches.

Each delay chain includes a number of serially-coupled delay elements 23. An output of each of the serially-coupled delay elements 23 is coupled to a corresponding power switch 21, each of which is implemented in this embodiment as a PMOS transistor. As a corresponding enable signal propagates through the delay elements 23 of the delay chain, power switches 21 are activated sequentially.

In the embodiment illustrated in FIG. 7, power switch segment 20A is coupled to receive a first enable signal, Enable 0. The first enable signal, when received by power switch segment 20A, propagates through delay elements 23 of the corresponding delay chain. As the first enable signal propagates through the delay chain of power switch segment 20A, the corresponding power switches 21 are sequentially activated.

Power gated block 20 also includes a timer 25 coupled to receive the first enable signal. More particularly, the first enable signal may be received on a start input of timer 25. Responsive to receiving the first enable signal, timer 25 may begin operating. The operation of timer 25 in the embodiment shown is synchronized to a clock signal received at the illustrated clock input. In one embodiment, timer 25 may be implemented as a counter and may thus count a number of cycles of the clock signal to determine the amount of time that has elapsed since the assertion of the first enable signal. The clock frequency, and thus the period, may be independent of PVT variations, and thus the predetermined time may remain the same for fast and slow cases. When timer 25 determines that a predetermined time as elapsed, a second enable signal, Enable 1 is asserted. Responsive to its assertion, the second enable signal is propagated through the serially-coupled delay elements 23 in power switch segment 20B. Responsive to propagation of the second enable signal, power switches 21 of the second power switch segment are sequentially activated.

Depending on PVT variations, the assertion of the second enable signal may or may not occur until after each power switch 21 of power switch segment 21 has been activated. This dependency is based on the magnitude of predetermined time prior to which timer 25 asserts the second enable signal, and whether or not the case is a fast case or a slow case. The predetermined time from the assertion of the first enable signal to the assertion of the second enable signal may be programmed into timer 25, or may be hardwired. In either case, the predetermined time may be set such that, in the fastest case, the second enable signal is not asserted until after all power switches 21 of power switch segment 20A have been activated. For at least some of the slower cases, the predetermined time of timer 25 may be set such that the second enable signal may be asserted before all power switches 21 of power switch segment 20A have been activated. In either case, the predetermined time of timer 25 may be set in accordance with di/dt specifications of the integrated circuit in which power gated block 14 is implemented.

FIG. 8 is a diagram illustrating another embodiment of a power gated block 14 utilizing a multi-path power switching scheme. More particularly, the embodiment shown in FIG. 8 extends the embodiment of FIG. 7 to more than two power switch segments. In this example, three power switch segments 20A-20C are shown, although additional instances may be included. Furthermore, the embodiment of power gated block 14 shown in FIG. 8 includes timers 25A and 25B. In general, the embodiment of power gated block 14 shown in FIG. 8 includes N power switch segments (wherein N is an integer value) and N−1 timers. Each of the timers may run for a predetermined time based on multiple of cycles of the received clock signal. In some embodiments that the predetermined time may differ from one timer to another (e.g., for embodiments wherein the number of delay elements and power switches is not uniform from one power switch segment to the next). However, in the embodiment shown in FIG. 8, it is assumed that the power switch segments are uniform and that the predetermined time is the same for each of the timers.

The operation of the embodiment shown in FIG. 8 may also be an extension of that shown in FIG. 7. When the first enable signal is received, sequential activation the power switches 21 of power switch 20A begins along with the operation of timer 25A. When the predetermined time of timer 25A has elapsed, a second enable signal is asserted. Assertion of the second enable signal initiates sequential activation of the power switches 21 in power switch segment 20B and also initiates operation of timer 25B. When the predetermined time of timer 25B has elapsed, a third enable signal ('Enable 2') is asserted, thereby initiating sequential activation of power switches 21 in power switch segment 20C. If additional power switch segments and timers are included, the assertion of the third enable signal may also cause the initiation of the next timer. The sequence may continue until an enable signal has been provided to each of the power switch segments and all power switches included therein have been activated.

As with the embodiment shown in FIG. 7, there may be some overlap in the activation of power switches 21 in one segment and the activation of power switches 21 of the next segment. The overlap may be determined by the predetermined time to which each timer is set, as well as PVT variations, which may determine the fast and slow cases. The predetermined time of the timers may be set such that, in the fastest case, no overlap is permitted, while some overlap may be permitted in the slower cases.

FIG. 9 illustrates another embodiment that may operate similarly to that of FIG. 8. However, instead of utilizing multiple timers, the timing function is consolidated into a single timer 25 configured to output the multiple enable signals. In the embodiment shown, the operation of timer 25 is initiated responsive to assertion of the first enable signal. Sequential activation of power switches 21 in power switch segment 20A is also initiated responsive to assertion of the first enable signal. After a predetermined time has elapsed, timer 25 may assert the second enable signal. Sequential activation of the power switches of power switch segment 20B is initiated responsive assertion of the second enable signal. Furthermore, timer 25 may then begin tracking time from the assertion of the second enable signal. When the predetermined time has elapsed from assertion of the second enable signal, timer 25 may assert the third enable signal and initiate sequential activation of power switches 21 of power switch segment 20C. This process may continue until each of the N enable signals has been asserted. As with the two previous embodiments utilizing multi-path power switch schemes, some overlap may occur at the slower cases. However, at the fastest cases, the predetermined time value may be set such that no overlap occurs between the activation of one power switch segment and another.

Figure 10:
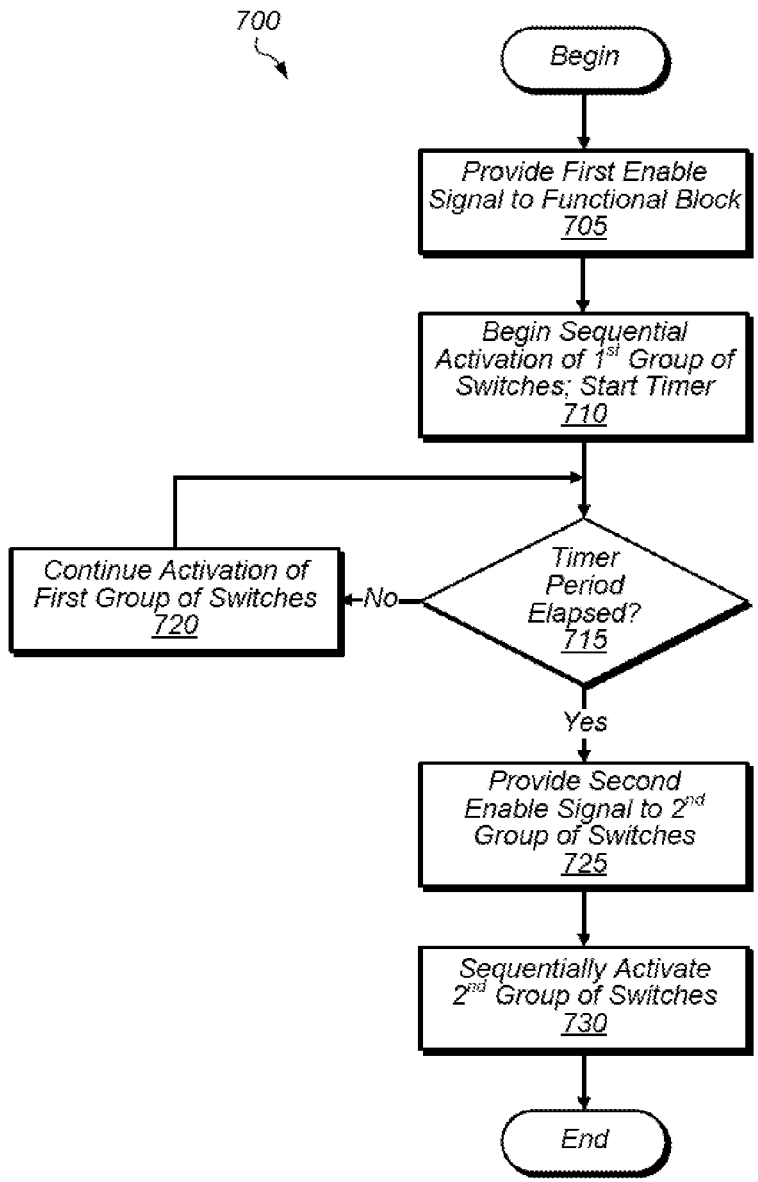
FIG. 10 is a flow diagram illustrating one embodiment of a method for powering up a functional block having separate delay chains for propagating enable signals to power switches.

Turning now to FIG. 10, a flow diagram illustrating one embodiment of a multi-path power switch scheme is shown. Method 700 of FIG. 10 is directed to an embodiment in which only two power switch segments are included. However, the method may be extended to embodiments having more than two power switch segments, as exemplified by the functional block embodiments shown in FIGS. 8 and 9.

Method 700 begins with the provision of an asserted enable signal to a power gated functional block (block 705). Responsive to assertion of the first enable signal to the functional block sequential activation of a first group of power switches is initiated (block 710). In addition to the sequential activation of the first group of power switches, operation of a timer is also initiated responsive to assertion of the first enable signal.

If the timer period has note elapsed (block 715, no), activation of the first group of switches may continue until all switches of the group are activated. This may or may not occur prior to the elapsing of the timer period, depending on the period itself and PVT variations. Once the timer period has elapsed (block 715, yes), a second enable signal may be asserted and provided to a second group of switches (block 725). Responsive to assertion of the second enable signal, the switches of the second group may be sequentially activated.

Figure 11:
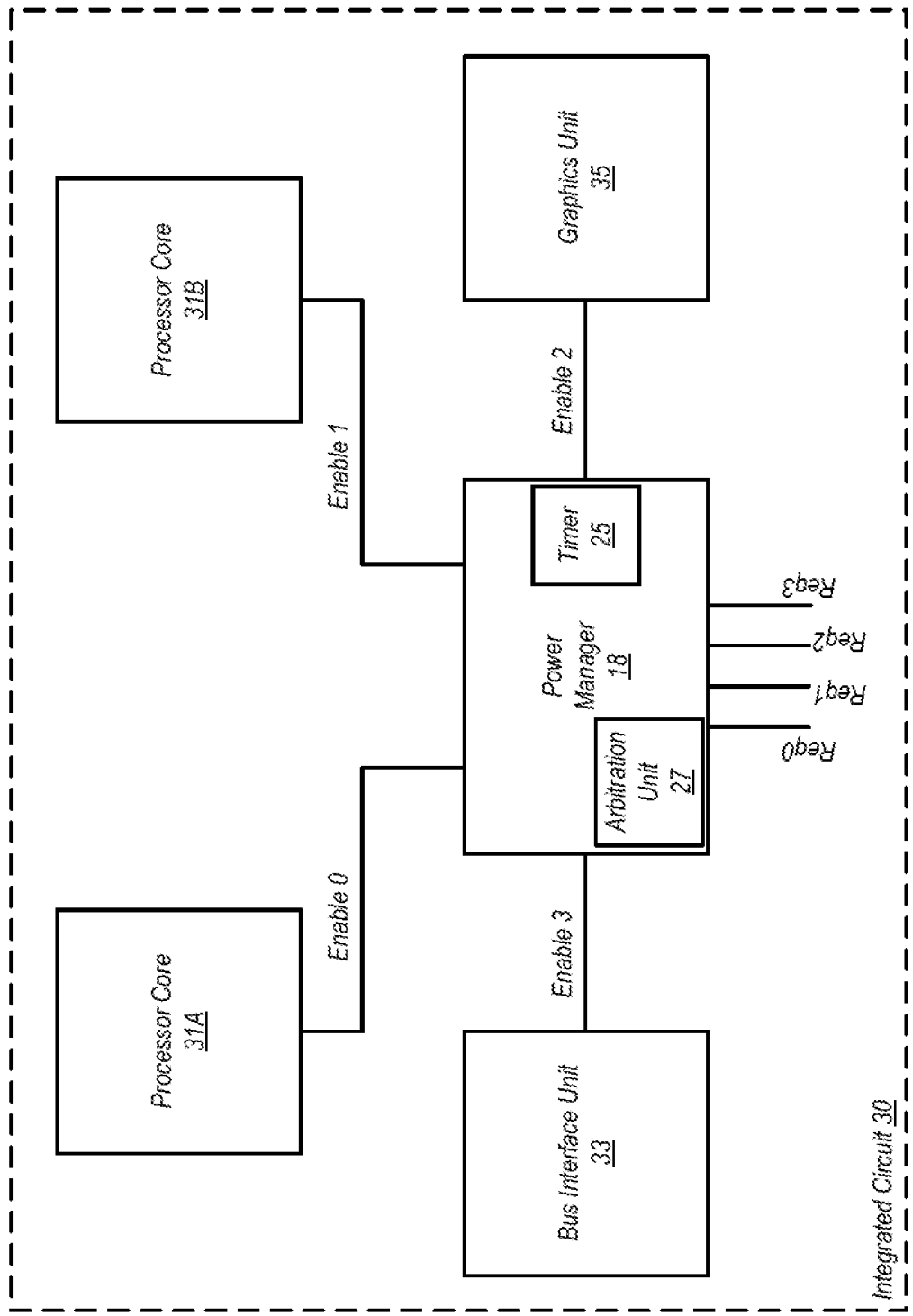
FIG. 11 is a block diagram of one embodiment of an IC configured to sequentially power up multiple functional block during a wakeup procedure.

Multi-Block Power Up Scheme:

The multi-path power switch scheme discussed above with reference to FIGS. 7-10 is directed to powering up multiple power switch segments in a single power gated functional block. FIGS. 11-13 are directed to a similar scheme that is extended to sequentially powering up multiple power gated functional blocks. The powering up of the functional blocks may be coordinated by a power manager that may enforce keep-out times (i.e. times where overlap is not permitted) in order to maintain operation within specified di/dt limits.

Turning now to FIG. 10, a block diagram illustrating an exemplary embodiment of an integrated circuit having multiple power gated blocks is shown. In the embodiment shown, integrated circuit 30 includes four power gated functional blocks: processor core 31A, processor core 31B, bus interface unit 33, and graphics unit 35. Each of the power gated functional blocks may include one or more power switch segments. The power switch segments of a given one of the power gated functional blocks may be arranged in accordance with any of the embodiments discussed above. Power switch segments arranged in accordance with embodiments not explicitly disclosed herein are also possible and contemplated. Furthermore, the arrangement of power switch segments need not be the same for all functional blocks. While such embodiments are possible, embodiments wherein the arrangement of power switch segments differs for at least one of the functional blocks relative to the others are possible and contemplated.

Integrated circuit 30 also includes a power management unit 18 that is configured to coordinate the powering up and powering down of the various power gated functional blocks. In the embodiment shown, power manager 18 includes a timer 25 and an arbitration unit 27. Timer 25 may be used to time the keep out period. A keep out period may be defined as predetermined time in which, upon initiation of a power switch activation for one functional block, power switch activation for additional functional blocks is not permitted. Power manager 18 may enforce the keep out period by inhibiting enable signals for additional functional blocks to be powered up. For example, if processor cores 31A and 31B, along with bus interface unit 33 are all to be powered up, power manager 18 may initially assert the enable signal ('Enable 0') for processor core 31A. As the power up procedure begins for processor core 31A, power manager 18 my inhibit the remaining enable signals for processor core 31B and bus interface unit 33 ('Enable 1' and 'Enable 3', respectively) for a first predetermined time. After the predetermined time has elapsed, the enable signal for processor core 31B may be asserted irrespective of whether processor core 31A has completed its power up procedure. However, the enable signal for bus interface unit 33 may remain inhibited for a second predetermined time (which may be, but is not necessarily, different from the first) subsequent to assertion of the enable signal for processor core 31B. After the second predetermined time has elapsed, power manager 18 may assert the enable signal for bus interface unit 33, regardless of whether processor core 31B has completed its power up procedure.

It is noted that the predetermined time of the keep out period may be different for the various functional blocks. For example processor core 31A may have a longer keep out period than bus interface unit 33. In general, the length of the keep out period may be determine at least in part on the amount of circuitry in the block and the amount of current drawn by the block when operating. Power gated functional blocks having more circuitry and/or a higher amount of current draw may have longer keep out periods than those with a smaller amount of circuitry and/or a smaller current draw.

Power manager 18 may be configured to process power on request for each of the power gated functional block of integrated circuit 30. In this example, four request lines, Req0, Req1, Req2, and Req3 are shown being provided to power manager 18 from an external source. Each of these requests corresponds to a particular functional block and corresponding enable signal (e.g., Reg0 corresponds to Enable 0 and processor core 31A, and so on). In addition to being able to receive power on requests from an external source, requests may also be generated internally to integrated circuit 30. For example, bus interface unit 33, when active, may generate a request to power on one or both of processor cores 31A and 31B responsive to receiving bus traffic from an external source. If multiple requests are received simultaneously (e.g., on the same clock cycle) or close together, arbitration unit 27 may perform an arbitration routine to determine the order in which the requests are to be processed. Any suitable arbitration scheme, such as round-robin, may be used to perform the arbitration. Upon completion of an arbitration routine, power manager 18 may assert the corresponding enable signals in the determined order while enforcing the keep out period for each of the functional blocks as they are powered up.

Figure 12A:
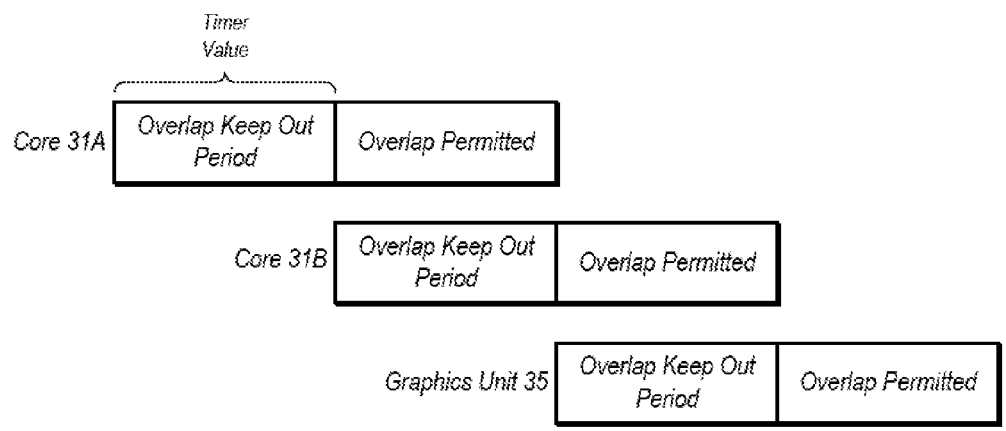
FIGS. 12A and 12B graphically illustrate a method and affect, respectively, of powering up multiple functional blocks of an integrated circuit.
Figure 12B:
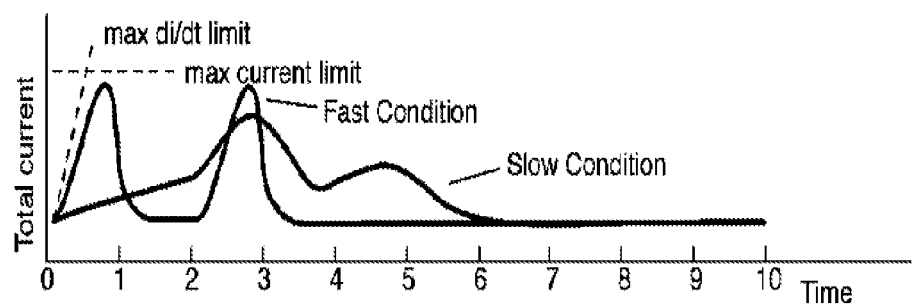
Figure 13:
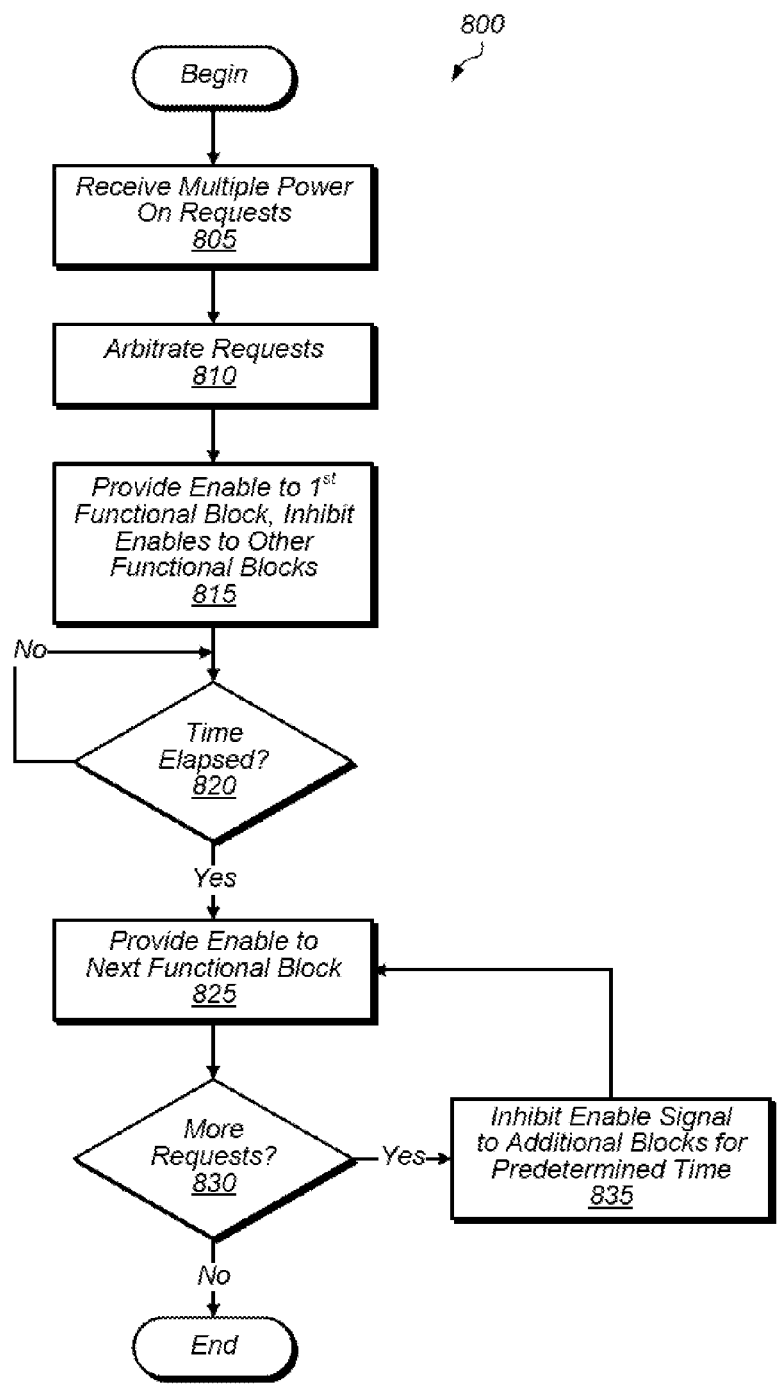
FIG. 13 is a method flow diagram of one embodiment of a method for powering up multiple functional blocks.

FIGS. 12A and 12B graphically illustrate the use of keep out periods and the effects of powering up functional blocks in slow and fast conditions. In the example of FIG. 12A, three power on requests have been simultaneously received and arbitrated. The results of the arbitration have determined that processor core 31A is to be powered up first, followed by processor core 31B, and finally graphics unit 35. Power is first applied to processor core 31A by asserting the corresponding enable signal and activating power switches therein. During a first portion of the power up procedure, the overlap keep out period is enforced for a period corresponding to the timer value. At this time, no other power gated functional blocks may begin powering up. Power manager 18 may enforce the keep out period by inhibiting (i.e. preventing assertion thereof) the enable signals corresponding to processor core 31B and graphics unit 35. After the keep out period has elapsed, overlap between the power up of two functional units may be permitted. Power manager 18 may assert the enable signal for processor core 31B when the keep out period for processor core 31A has elapsed. During the keep out period for processor core 31B, the enable signal corresponding to graphics unit 35 may remain inhibited. Upon expiration of the keep out period for processor core 31B, the enable signal for graphics unit 35 may be asserted. Although no other power gated functional block are shown as being powered up subsequent to graphics unit 35, a keep out period may nevertheless be enforced if additional power on requests have been received by power manager 18.

Although overlap may be permitted, it does not occur in all cases. As previously noted, PVT variations can result in fast and slow cases. FIG. 12B graphically illustrates a difference between fast and slow cases for two functional blocks. In the fast case, the total current peaks are greater than those in the slow cases. Furthermore, the slope representing di/dt is greater for the fast case than the slow case. Since the current peaks are reached faster during the fast case, power gated functional blocks are powered on faster. Accordingly, in the fast case shown here, there is no overlap between the powering on of two functional blocks, and thus the power on procedures may performed within specified limits for total current and di/dt. In the slow cases, the current peaks are smaller and the slope of di/dt is less than the faster cases. Thus, while significant overlap may occur during the slow cases, the smaller current peaks and smaller slope of di/dt may remain well within specified limits. It is noted that the graphical illustration of FIG. 12B, while applying to the powering on of power gated functional blocks, may also apply to the activation of power switches in power switch segments within a functional block.

FIG. 13 is a flow diagram of one embodiment of a method for powering on multiple functional blocks. In the embodiment shown, method 800 begins with receiving of multiple power on requests (block 805) and the arbitration of the requests to determine an order in which corresponding functional blocks are to be powered on (block 810). It is noted that in some cases, only a single request is received and thus no arbitration is necessary.

Upon completion of the arbitration, a power manager may provide an enable signal to the first functional block to be powered on, with a keep out period enforced (block 815). The keep out period may be enforced by inhibiting the enable signals for the other power gated functional blocks for which requests were received. The keep out period may continue to be enforce as long as its corresponding time period has not elapsed (block 820, no). When the keep out period has elapsed (block 820, yes), an asserted enable signal may be provide to the next functional block to be powered on (block 825). The next functional block may begin its power on procedure responsive to receiving the enable signal. If there are additional power on requests to be satisfied (block 830, yes), additional functional blocks may be prevented from receiving an enable signal during a keep out period corresponding to the functional block presently being powered on (block 835). It is noted that overlap between the power on procedures of the present and previously enabled blocks is possible in some cases, as discussed above. Once the keep out period has expired, the functional block to be powered on may receive an asserted enable signal from the power manager. If no additional functional blocks are to be powered on (block 830, no), then method 800 is complete.

Figure 14:
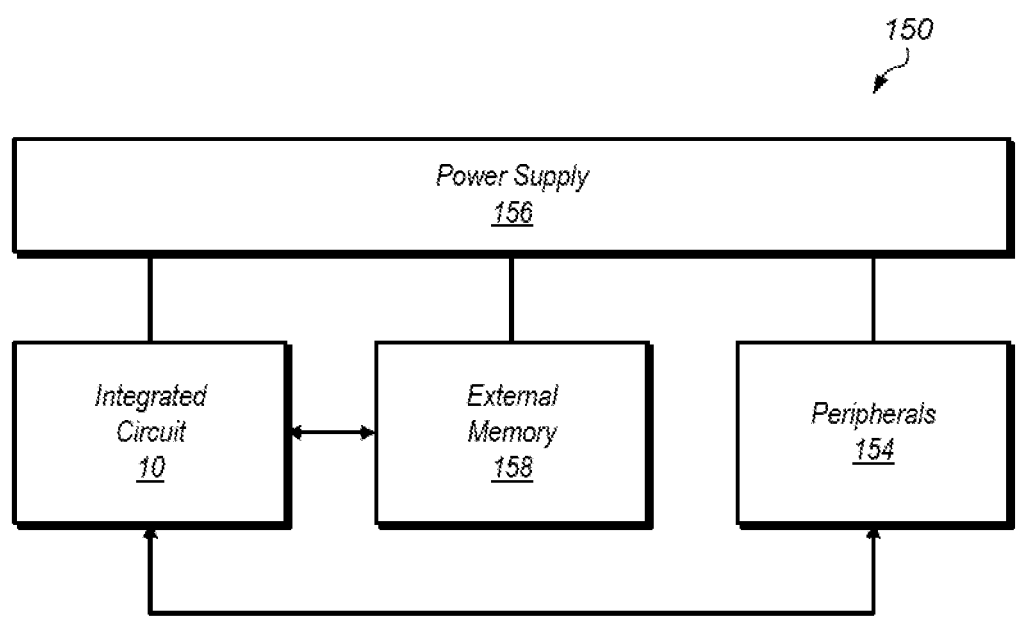
FIG. 14 is a block diagram of one embodiment of a system.

Exemplary System:

Turning next to FIG. 14, a block diagram of one embodiment of a system 150 is shown. In the illustrated embodiment, the system 150 includes at least one instance of an integrated circuit 10 (e.g., from FIG. 1) coupled to one or more peripherals 154 and an external memory 158. In some embodiments, an integrated circuit similar to integrated circuit 30 of FIG. 11 may be included instead of, or in addition to integrated circuit 10. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMM5), etc. Memory 158 may in some embodiments be the equivalent of memory 5 shown in FIG. 1, and thus may be coupled to integrated circuit 10 via a number of interface circuits 100.

Numerous variations and modifications will become apparent to those skilled in the art once the above disclosure is fully appreciated. It is intended that the following claims be interpreted to embrace all such variations and modifications.

What is claimed is:

1. An integrated circuit comprising
a power gated circuit block coupled to receive power via a virtual voltage node, the virtual voltage node being exclusive to the power gated circuit block;
a plurality of delay elements coupled in series and configured to propagate an enable signal received by each of a plurality of transistors coupled between the virtual voltage node and a global voltage node that is non-exclusive to the power gated circuit block, wherein one or more of the plurality of delay elements is configured to reduce an amount of delay responsive to detecting an increase in voltage on the virtual voltage node.

2. The integrated circuit as recited in claim 1, wherein one or more of the plurality of delay elements is configured to continuously reduce an amount of delay as the voltage on the virtual voltage node increases.

3. The integrated circuit as recited in claim 1, wherein the one or more of the plurality of delay elements includes:
a first inverter; and
a first passgate coupled between the first inverter and the global voltage node.

4. The integrated circuit as recited in claim 3, wherein the first passgate includes a first transistor having a respective gate terminal coupled to a ground node, and a second transistor having a respective gate terminal coupled to the virtual voltage node.

5. The integrated circuit as recited in claim 4, wherein the one or more of the plurality of delay elements includes:
a second inverter having an input coupled to an output of the first inverter; and
a second passgate coupled between the second inverter and the ground node.

6. The integrated circuit as recited in claim 1, further comprising a power control unit configured to propagate the enable signal into a first one of the plurality of delay elements.

7. The integrated circuit as recited in claim 6, wherein the power control unit includes a voltage detection circuit configured to detect a value of the voltage present on the virtual voltage node.

8. The integrated circuit as recited in claim 7, wherein the power control unit is configured to provide a delay control signal to the one or more of the plurality of delay elements, and wherein the delay control signal is configured to cause a reduction to the amount of delay provided by the one or more of the plurality of delay elements by asserting the delay control signal responsive to the voltage detection circuit detecting that the voltage on the virtual voltage node exceeds a predetermined threshold.

9. The integrated circuit as recited in claim 7, wherein the power control unit is configured to provide a delay control signal to the one or more of the plurality of delay elements, wherein the delay control signal has a voltage that is adjustable responsive to a change of the voltage detected on the virtual voltage node by the voltage detection circuit, and wherein the one or more of the plurality of delay elements are configured to adjust their respective delay responsive to adjustments of the delay control signal.

10. A method comprising:
propagating an enable signal through a serially-coupled plurality of delay elements;
providing the enable signal to a gate terminal of each of a plurality of power transistors of a power-gated circuit block, wherein each of the power transistors is coupled between a virtual voltage node exclusive to the power-gated circuit block and a global voltage node that is not exclusive to the power-gated circuit block, wherein respective outputs of at least a subset of the plurality of delay elements are coupled to the gate terminal of a corresponding one of the plurality of power transistors; and
increasing a rate at which the enable signal is propagated through the plurality of delay elements by reducing an amount of delay provided from the plurality of delay elements responsive to detecting an increase in a voltage on the virtual voltage node.

11. The method as recited in claim 10, further comprising:
comparing the voltage on the virtual voltage node to a predetermined value;
propagating the enable signal at a first rate if the voltage on the virtual voltage node is less than the predetermined value; and
propagating the enable signal at a second rate greater than the first rate if the voltage on the virtual voltage node is greater than the predetermined value, wherein propagating the enable signal at the second rate comprises reducing the amount of delay provided by at least a subset of the plurality of delay elements.

12. The method as recited in claim 10, further comprising continuously decreasing the amount of delay provided by at least a subset of the plurality of delay elements as the voltage on the virtual voltage node increases.

13. The method as recited in claim 10, further comprising a power control unit causing a reduction of an amount of delay provided by at least a subset of the plurality of delay elements responsive to an increase in voltage on the virtual voltage node.

* * * * *